United States Patent [19]
Kutscher

[11] Patent Number: 5,968,595
[45] Date of Patent: Oct. 19, 1999

[54] OXIDE COATED CUTTING TOOL WITH INCREASED WEAR RESISTANCE AND METHOD OF MANUFACTURE THEREOF

[75] Inventor: Åsa Kutscher, Älvsjö, Sweden

[73] Assignee: Sandvik AB, Sandviken, Sweden

[21] Appl. No.: 09/047,221

[22] Filed: Mar. 25, 1998

Related U.S. Application Data

[62] Division of application No. 08/675,678, Jul. 3, 1996.

[30] Foreign Application Priority Data

Jul. 14, 1995 [SE] Sweden ................................ 9502638

[51] Int. Cl.$^6$ ................................................ C23C 16/00
[52] U.S. Cl. ...................... 427/255.1; 427/248.1; 427/255.2; 427/255.3; 427/255.7
[58] Field of Search ............................ 427/248.1, 255.1, 427/255.2, 255.3, 255.7

[56] References Cited

U.S. PATENT DOCUMENTS

| | | |
|---|---|---|
| 4,180,400 | 12/1979 | Smith et al. . |
| 4,619,866 | 10/1986 | Smith et al. . |
| 5,071,696 | 12/1991 | Chatfield et al. . |
| 5,137,774 | 8/1992 | Ruppi . |
| 5,162,147 | 11/1992 | Ruppi . |
| 5,487,625 | 1/1996 | Ljungberg et al. . |
| 5,545,490 | 8/1996 | Oshika . |
| 5,652,045 | 7/1997 | Nakamura et al. . |

FOREIGN PATENT DOCUMENTS

| | | |
|---|---|---|
| 0523021 A1 | 1/1993 | European Pat. Off. . |
| 63-195268 | 8/1988 | Japan . |
| 6-190605 | 7/1994 | Japan . |
| 501527 | 3/1995 | Sweden . |
| 502223 | 9/1995 | Sweden . |

OTHER PUBLICATIONS

Characterization of $\alpha$-Al$_2$O$_3$, $\kappa$-Al$_2$O$_3$, and $\alpha$-$\kappa$ Multioxide Coatings on Cemented Carbides, S. Vuorinen et al., Thin Solid Films, Dec. 1990, pp. 536–546.

Primary Examiner—Archene Turner
Attorney, Agent, or Firm—Burns, Doane, Swecker & Mathis, L.L.P.

[57] ABSTRACT

An oxide coated cutting tool including a body coated with refractory single- or multilayers one of which consists of single-phase $\kappa$-Al$_2$O$_3$ characterized by controlled microstructure with crystal planes preferably grown in the (210)-direction with respect to the exposed sure of the coated body. The oxide coated cutting tool exhibits increased wear properties when machining ball bearing steel.

10 Claims, 1 Drawing Sheet

5,968,595

OXIDE COATED CUTTING TOOL WITH INCREASED WEAR RESISTANCE AND METHOD OF MANUFACTURE THEREOF

This application is a divisional, of application Ser. No. 08/675,678, filed Jul. 3, 1996 now abandoned.

FIELD OF THE INVENTION

The present invention relates to an oxide coated cutting tool for chipforming machining.

BACKGROUND OF THE INVENTION

Chemical vapour deposition ("CVD") of alumina on cutting tools is a well established technology. The wear properties of $Al_2O_3$ as well as of other refractory materials have been discussed extensively in the literature.

The CVD-technique has also been used to produce coatings of other metal oxides, carbides and nitrides, the metal being selected from transition metals of the IVB, VB and VIB groups of the Periodic Table of the Elements. Many of these compounds have found practical applications as wear resistant or protective coatings, but few have received as much attention as TiC, TiN and $Al_2O_3$.

$Al_2O_3$ crystallizes in several different phases: $\alpha$, $\kappa$, $\gamma$, $\beta$, $\theta$, etc. The two most frequently occurring phases in CVD of wear resistant $Al_2O_3$—coatings are the thermodynamically stable, hexagonal a-phase and the metastable $\kappa$-phase. Generally, the $\kappa$-phase is fine-grained with a grain size in the range 0.5–3.5 $\mu$m and often exhibiting a columnar coating morphology. Furthermore, $\kappa$-$Al_2O_3$ coatings are free from crystallographic defects and free from micropores or voids. The crystallographic structure of $\kappa$-$Al_2O_3$ is basically orthorombic and the unit cell can be expressed with orthogonal indices which might be transformed to a hexagonal unit cell with hexagonal indices.

The $\alpha$-$Al_2O_3$ grains in mixed $\alpha$+$\kappa$-$Al_2O_3$ coatings are usually coarser with a grain size of 1–6 $\mu$m depending upon the deposition conditions. Porosity and crystallographic defects are in this case frequently occurring.

On commercial cutting tools, $Al_2O_3$ is always applied on $TiC_xN_yO_z$ coated carbide or ceramic substrates (see, e.g., U.S. Pat. No. 3,837,896, now Reissue U.S. Pat. Reissue No. 29,420 and U.S. Pat. No. 5,071,696) and the interfacial chemical reactions between the $TiC_xN_yO_z$—surface and the alumina coating are of particular importance.

The practice of coating cemented carbide cutting tools with oxides to further increase their wear resistance is in itself well known as is evidenced in, e.g., U.S. Pat. Reissue No. 29,420 and U.S. Pat. Nos. 4,399,168, 4,018,631, 4,490, 191 and 4,463,033. These patents disclose oxide coated bodies and how different pretreatments, e.g., of TiC-coated cemented carbide, enhance the adherence of the subsequently deposited oxide layer. Alumina coated bodies are further disclosed in U.S. Pat. Nos. 3,736,107, 5,071,696 and 5,137,774 wherein the $Al_2O_3$-layers comprise $\alpha$, $\kappa$ and/or $\alpha$+$\kappa$-combinations.

U.S. Pat. No. 4,619,866 describes a method for producing fast growing $Al_2O_3$-layers by utilizing a hydrolysis reaction of a metal halide under the influence of a dopant, e.g., hydrogen sulphide ($H_2S$). The resulting coating consists of a mixture of the smaller $\kappa$-grains and the larger $\alpha$-grains. The process yields coatings with an even layer thickness distribution around the coated body.

U.S. Pat. No. 5,071,696 discloses a body coated with single-phase $\kappa$-$Al_2O_3$ deposited epitaxially onto an MX-layer where MX is a carbide, carbonitride or oxycarbonitride of a metal from the Groups IVB, VB or VIB of the periodic table. Swedish Patent Application No. 9101953-9 discloses a method of growing a fine-grained $\kappa$-alumina coating.

Single-phase $\alpha$-$Al_2O_3$-layer with preferred crystal growth orientation in the (012)-direction is disclosed in Swedish Patent Application No. 9203852-0, in the (110)-direction is disclosed in Swedish Patent Application No. 9304283-6 and in the (104)-direction is disclosed in Swedish Patent Application No. 9400089-0.

SUMMARY OF THE INVENTION

An object of the invention is to overcome disadvantages and drawbacks of prior art oxide coated cutting tool inserts.

Another object of the present invention is to provide onto a cemented carbide substrate or preferably onto the aforementioned $TiC_xN_yO_z$ coating at least one essentially single-phase $Al_2O_3$-layer of the polymorph $\kappa$ with a desired microstructure and crystallographic texture using suitable nucleation and growth conditions such that said properties of the $Al_2O_3$-layer are stabilized.

It is a further object of the invention to provide an alumina coated cutting tool insert with improved cutting performance when machining ball bearing steel.

DETAILED DESCRIPTION OF THE PREFERRED EMBODIMENTS

Figure 1:
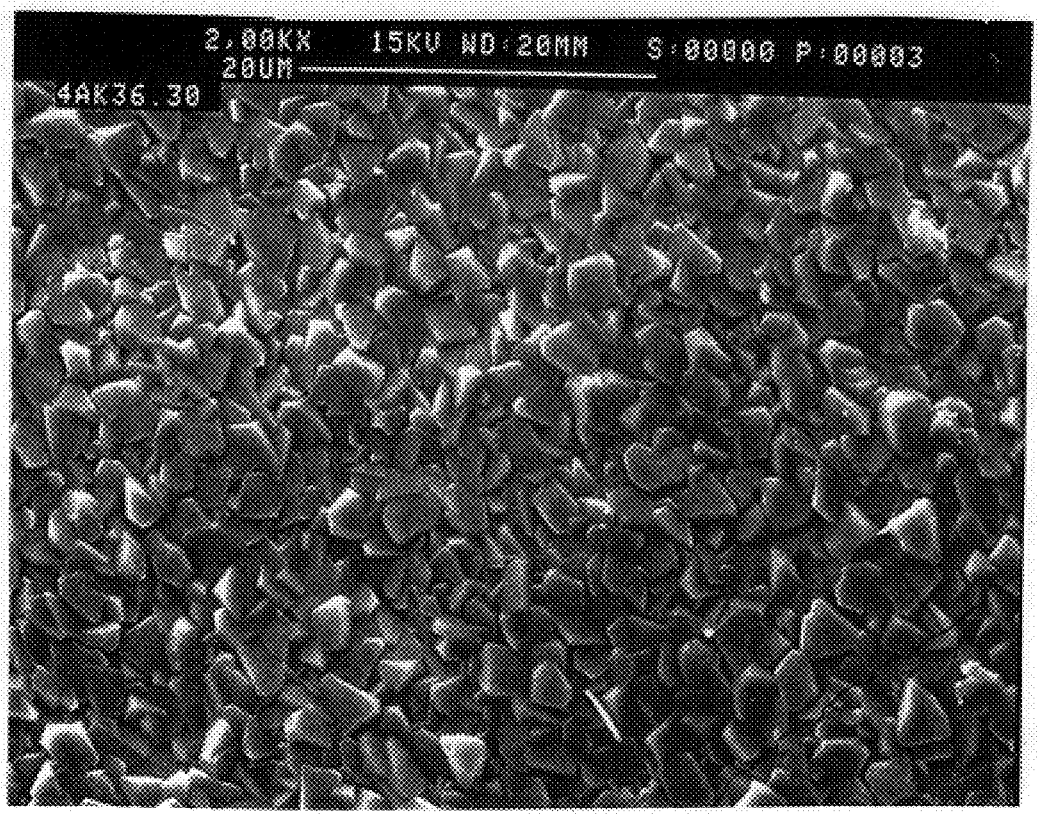
FIG. 1 shows a Scanning Electron microscope (SEM) top-view micrograph at 2000X magnification of a typical $AlO_3$-coating produced with the claimed process.

According to the invention there is provided a cutting tool comprising a body of cemented carbide onto which a wear resistant coating has been deposited. The coating comprises one or more refractory layers of which at least one layer is a dense and textured $Al_2O_3$-layer of the $\kappa$ polymorph.

A cutting tool coated according to the present invention exhibits improved wear resistance compared to prior art tools when machining ball bearing steel with coolant.

More specifically, the coated tool comprises a substrate of a sintered cemented carbide body, cermet or a ceramic body preferably of at least one metal carbide in a metal binder phase. The individual layers in the coating structure may be TiC or related carbide, nitride, carbonitride, oxycarbide and oxycarbonitride of a metal selected from the group consisting of metals in the Groups IVB, VB and VIB of the Periodic Table of the Elements, B, Al and Si and/or mixtures thereof. At least one of said layers is in contact with the substrate. However, at least one of the layers in the coating structure comprises a fine-grained, dense, essentially single-phase $\kappa$-$Al_2O_3$ coating free of microporosity and crystallographic defects. This coating is preferentially textured with a thickness of d=0.5–25 $\mu$m, preferably 1–10 $\mu$m and with a grain size of 0.5–6 $\mu$m, preferably 0.5–4 $\mu$m.

The $Al_2O_3$ -layer according to the invention has a preferred crystal growth orientation in the (210) direction which is determined by X-ray Diffraction (XRD) measurements. A Texture Coefficient, TC, can be defined as:

$$TC(hkl) = \frac{I(hkl)}{I_0(hkl)} \left\{ \frac{1}{n} \sum \frac{I(hkl)}{I_0(hkl)} \right\}^{-1}$$

where:

I(hkl)=measured intensity of the (hkl) reflection;

$I_o$(hkl)=standard intensity of the ASTM standard powder pattern diffraction data;

n=number of reflections used in the calculation, (hkl) reflections used are: (002), (112), (013), (122), (113), (032), (210), (222), (050).

According to the invention, TC for the set of (210) crystal planes is larger than 1.5, preferably larger than 2.5 and most preferably larger than 3.0.

In a preferred embodiment, the alumina layer according to the present invention is preferably the outermost layer but there may also be deposited on top of it one or more further layers such as a thin <1 μm thick TiN-layer.

In yet a further preferred embodiment, said alumina layer is in contact with a $TiC_xN_yO_z$-layer which preferably is the innermost layer of the coating.

The textured $Al_2O_3$-coating according to the invention is obtained by careful control of the process conditions during the nucleation of the $Al_2O_3$. It is furthermore of vital importance to set the oxidation potential of the process gases, i.e., the water vapour concentration, prior to the $Al_2O_3$-nucleation to less than 5 ppm. The nucleation of $Al_2O_3$ is initiated by a controlled sequencing of the reactant gases as follows: $H_2$ and HCl are first allowed into the reactor followed by $AlCl_3$ and at last $CO_2$. The amount of HCl added should be controlled to be between 2.5 and 10% by volume, preferably between 3.0 and 6.0% by volume, most preferably between 3.5 and 5.0% by volume during the nucleation. The temperature shall preferably be between 950 and 1000° C. during the nucleation. The growth step in the alumina deposition process may be performed at the same temperature as the nucleation step but a dopant, such as a sulphur containing gas, preferably $H_2S$, is added in order to enhance the deposition rate. However, the exact conditions depend to a certain extent on the design of the equipment used. It is within the purview of the skilled artisan to determine whether the requisite texture and coating morphology have been obtained and to modify the nucleation and the deposition conditions in accordance with the present specification, if desired, to effect the amount of texture and coating morphology.

It has also been found that a smooth coating surface will further improve the cutting performance of the tool insert. A smooth coating surface can be obtained by a gentle wet-blasting of the coating surface with fine grained (400–150 mesh) alumina powder or by brushing the edges with brushes based on, e.g., SiC as disclosed in Swedish Patent Application No. 9402543-4.

The invention is described with reference to the following examples which are merely illustrative of various aspects of the invention.

EXAMPLE 1

Sample A. Cemented carbide cutting inserts with the composition 5.5% by weight Co, 8.6% by weight cubic carbides and balance WC were coated in a chemical vapour deposition process with 4 μm of TiCN. In a subsequent process within the same coating cycle, a 6 μm thick κ-$Al_2O_3$ layer was applied. The $Al_2O_3$ coating process was divided into two parts: a nucleation part and one growth part during which the process was catalyzed using $H_2S$ as dopant.

During the nucleation step of $Al_2O_3$, the process parameters were controlled in order to promote the (210) texture of the $Al_2O_3$-layer.

Prior to the $Al_2O_3$ deposition process, the oxidation potential of the gas passing through the reactor was kept at a minimum to ensure that the surface composition would promote κ-$Al_2O_3$ deposition.

The process conditions during the $Al_2O_3$ deposition process were:

|  | Nucleation | Growth |
| --- | --- | --- |
| $CO_2$ % by volume | 3.5 | 3.5 |
| $AlCl_3$, % by volume | 2.3 | 2.3 |
| HCl, % by volume | 3.5 | 4.5 |
| $H_2S$, % by volume | — | 0.4 |
| $H_2$ | balance | balance |
| Pressure, mbar | 55 | 55 |
| Temperature, ° C. | 980 | 980 |
| Duration, hours | 1 | 8.5 |

XRD-analysis showed that the coating consisted of single phase κ-$Al_2O_3$ with a texture coefficient TC(210) of 3.3 of the (210) planes. SEM-studies showed a 6 μm thick $Al_2O_3$-layer.

Sample B. Cemented carbide cutting inserts of the same composition as in Sample A above were subjected to a coating process and coated with 5 μm of TiCN and then 5.8 μm of κ-$Al_2O_3$. The κ-$Al_2O_3$ deposition was performed according to a prior art technique.

XRD analysis of the coating showed that the $Al_2O_3$ consisted of single-phase κ$Al_2O_3$, with a texture coefficient TC(013) of 3.1 of the (013) planes.

Sample C. Cemented carbide cutting inserts according to Sample A were coated in a process with TiCN followed by an $Al_2O_3$ process according to a prior art technique resulting in a mixture of coarse α-$Al_2O_3$ grains and fine κ-$Al_2O_3$ grams. On a polished cross-section, the coating thicknesses were found to be 5.0 μm of TiCN and about 6.2 μm for the mixed-phase $Al_2O_3$. An XRD investigation showed that the ratio κ/α was about 0.4. The κ-$Al_2O_3$ exhibited a texture coefficient TC (013) of 2.6 of the (013)-planes and the α-$Al_2O_3$ showed no preferred orientation.

Sample D. Inserts from deposition in Sample A were subjected to a heat treatment for 8 hours in flowing $H_2$-atmosphere. This resulted in a transformation of κ-$Al_2O_3$ to 100% α-$Al_2O_3$. According to XRD-analysis the α-$Al_2O_3$ exhibited a texture coefficient TC of 1.5 of the (104) planes as well as of the (110)-planes.

The inserts according to this Example were then tested with respect to flank wear resistance in a longitudinal tuning operation of machining ball bearing steel (similar to DIN 100 Cr Mo 6).

Cutting data:

Speed: 200 m/min

Cutting depth: 2.0 mm

Feed: 0.36 mm/rev

Coolant was used

The results are expressed in Table 1 below as working time required to reach a predetermined flank wear of 0.3 mm on the cutting inserts.

TABLE 1

| Sample | Coating | Time to reach 0.3 mm flank wear, in minutes | |
|---|---|---|---|
| | | Test 1 | Test 2 |
| A | κ-Al$_2$O$_3$ (210) | 22.5 | 22.5 (invention) |
| B | κ-Al$_2$O$_3$ (013) | 15 | 17.5 |
| C | α + κ-Al$_2$O$_3$ | 15 | 15 |
| D | heat treated Sample A | 15 | 17.5 |

EXAMPLE 2

Sample E. Cemented carbide cutting inserts with the composition 5.5% by weight Co, 8.6% by weight cubic carbides and balance WC as in Example 1 above were coated in a Chemical Vapour Deposition (CVD) process with 4 μm of TiCN followed by 5.8 μm of κ-Al$_2$O$_3$ according to the invention.

The process conditions during the Al$_2$O$_3$ deposition process were:

| | Nucleation | Growth |
|---|---|---|
| CO$_2$, % by volume | 3.5 | 3.5 |
| AlCl$_3$, % by volume | 2.3 | 2.3 |
| HCl, % by volume | 5.0 | 3.5 |
| H$_2$S, % by volume | — | 0.4 |
| H$_2$ | balance | balance |
| Pressure, mbar | 55 | 55 |
| Temperature, ° C. | 980 | 980 |
| Duration, hours | 1 | 8.5 |

XRD-analysis showed that the coating consisted of single phase κ-Al$_2$O$_3$ with a texture coefficient TC(210) of 2.2 of the (210) planes.

Sample F. Cemented carbide cutting inserts of the same composition as in Sample E above were subjected to a coating process and coated with 4 μm of TiCN and then 6.3 μm of κ-Al$_2$O$_3$. The κ-Al$_2$O$_3$ deposition was performed according to a prior art technique.

XRD analysis of the coating showed that the Al$_2$O$_3$ consisted of single-phase κ-Al$_2$O$_3$ with crystal (013)-orientation, with a texture coefficient TC of 3.2 of the (013)-plane. SEM studies of the inserts showed that the alumina layer had an average grain-size of 2.8 μm.

Sample G. Cemented carbide cutting inserts according to Sample C in Example 1 above.

The inserts according to this Example were then tested with respect to flank wear resistance in a longitudinal turning operation of machining ball bearing steel (similar to DIN 100 Cr Mo 6).

Cutting data:
Speed: 200 m/min
Cutting depth: 2.0 mm
Feed; 0.36 mm/rev
Coolant was used The results are expressed in Table 2 below as wording time required to reach a predetermined flank wear of 0.3 mm on the cutting inserts.

TABLE 2

| Sample | Coating | Time to reach 0.3 mm flank wear, in minutes | |
|---|---|---|---|
| | | Test 1 | Test 2 |
| E | κ-Al$_2$O$_3$ (210) | 30 | 35 (invention) |
| F | κ-Al$_2$O$_3$ (013) | 22 | 22.5 |
| G | α + κ-Al$_2$O$_3$ | 12.5 | 15 |

EXAMPLE 3

Insert A of Example 1 was wet-blasted with 150 mesh Al$_2$O$_3$ after the coating processes in order to smoothen the layer. The inserts were then tested in a facing operation of machining SS2172-4. Edge line flaking is the critical wear mechanism in this turning operation Cutting data;
Speed: 130 m/min
Feed: 0.2 mm/rev
Cutting depth: 2.0 mm The shape of the workpiece was such that the cut was interrupted three times during each revolution.

| | Flaking (%) Edge line |
|---|---|
| Insert B Example 1 | 78 |
| Insert A Example 1 | 67 |
| Insert A Example 1, wet blasted | 3 |

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of coating a body with a κ-alumina coating, the method comprising introducing the body into a reactor, contacting the body with process gases including a hydrogen carrier gas containing one or more halides of aluminum and a hydrolyzing and/or oxidizing agent at high temperature and depositing the κ-alumina coating on the body, the process gases having a low oxidation potential prior to nucleation of the alumina coating by maintaining a total concentration of H$_2$O or other oxidizing species below 5 ppm, the nucleation of alumina being initiated by controlled sequencing of the process gases such that HCl first enters the reactor in a H$_2$ atmosphere followed by AlCl$_3$ and then CO$_2$, the amount of HCl being controlled to be 2.5–10% by volume, the temperature being between 950–1000° C. during the nucleation and a sulphur containing gas being added during the growth of the Al$_2$O$_3$.

2. The method of coating a body with a κ-alumina coating according to claim 1, wherein the body comprises a cutting tool insert and the amount of HCl is controlled to be 3.5–5% by volume.

3. The method of coating a body with a κ-alumina coating according to claim 1, the alumina coating being subjected to a post-treatment.

4. The method of coating a body with a κ-alimina coating according to claim 1, wherein the sulfur containing gas comprises H$_2$S.

5. The method of coating a body with a κ-alumina coating according to claim 1, wherein the body comprises a cutting tool body and the alumina coating has a thickness of 0.5–25 μm and consists of single-phase κ-Al$_2$O$_3$ textured in the (210)-direction with a texture coefficient larger than 1.5, the texture coefficient being defined as below:

$$TC(hkl) = \frac{I(hkl)}{I_0(hkl)} \left\{ \frac{1}{n} \sum \frac{I(hkl)}{I_0(hkl)} \right\}^{-1}$$

where

I(hkl)=measured intensity of the (hkl) reflection

I$_o$(hkl)=standard intensity of the ASTM standard powder pattern diffraction data; and n=number of reflections used in the calculation, (hkl) reflections used are: (002), (112), (013), (122), (113), (032), (210), (222), (050).

6. The method of coating a body with a κ-alumina coating according to claim 1, wherein the alumina coating is an outermost layer.

7. The method of coating a body with a κ-alumina coating according to clam 1, wherein the alumina coating is in contact with a TiC$_x$N$_y$O$_z$ layer.

8. The method of coating a body with a κ-alumina coating according to claim 7, wherein the TiC$_x$N$_y$O$_z$ layer is an innermost layer.

9. The method of coating a body with a κ-alumina coating according to claim 1, wherein on top of the alumina coating is a $\leq 1$ μm thick TiN-layer.

10. The method of coating a body with a κ-alumina coating according to claim 1, wherein the body is a cutting tool of cemented carbide, titanium based carbonitride or ceramics.

* * * * *